(12) United States Patent
Snow

(10) Patent No.: US 7,782,990 B1
(45) Date of Patent: Aug. 24, 2010

(54) METHOD OF AND CIRCUIT FOR OVERSAMPLING A SIGNAL IN AN INTEGRATED CIRCUIT

(75) Inventor: John F. Snow, Taylorsville, UT (US)

(73) Assignee: Xilinx, Inc., San Jose, CA (US)

( * ) Notice: Subject to any disclaimer, the term of this patent is extended or adjusted under 35 U.S.C. 154(b) by 975 days.

(21) Appl. No.: 11/527,880

(22) Filed: Sep. 27, 2006

(51) Int. Cl.
*H04L 7/00* (2006.01)

(52) U.S. Cl. .................................... 375/355

(58) Field of Classification Search .............. 375/354, 375/355, 326, 373–376; 327/141, 144, 145–163
See application file for complete search history.

(56) References Cited

U.S. PATENT DOCUMENTS

| | | | | |
|---|---|---|---|---|
| 7,292,662 | B2 * | 11/2007 | Gregorius | 375/350 |
| 2004/0202266 | A1 * | 10/2004 | Gregorius et al. | 375/355 |
| 2005/0135527 | A1 * | 6/2005 | Masui et al. | 375/355 |
| 2005/0232366 | A1 * | 10/2005 | Wood, Jr. | 375/257 |
| 2006/0208785 | A1 * | 9/2006 | Lee et al. | 327/276 |
| 2006/0227917 | A1 * | 10/2006 | Buchwald et al. | 375/355 |

OTHER PUBLICATIONS

John F. Snow; "Efficient 8X Oversampling Asynchronous Serial Data Recovery Using IDELAY"; XAPP861; Application Note; (v1.0); Oct. 13, 2006; available from www.xilinx.com; pp. 1-11.
Chuang, Jerry et al., Xilinx, Inc., "High Speed Transceiver Receiving Lower Rate Data", U.S. Appl. No. 10/930,579, filed Aug. 31, 2004, pp. 1-44, available from Xilinx Inc., 2100 Logic Drive, San Jose, CA.
Sawyer, Nick, Xilinx, Inc., "Data Recovery", XAPP224, Jul. 11, 2005, pp. 1-7, v2.5, available from Xilinx Inc., 2100 Logic Drive, San Jose, CA 95124.

* cited by examiner

*Primary Examiner*—David C Payne
*Assistant Examiner*—Vineeta S Panwalkar
(74) *Attorney, Agent, or Firm*—John J. King

(57) ABSTRACT

A method of oversampling a signal in an integrated circuit is disclosed. The method comprises receiving a reference clock signal; generating at least one delayed clock signal, each having a different phase; receiving an input data signal; generating at least one delayed data signal based upon the input data signal; and generating a plurality of phase-shifted output signals, each phase-shifted output signal being based upon a different combination of a clock signal and a data signal. A circuit for oversampling a signal in an integrated circuit is also disclosed.

19 Claims, 6 Drawing Sheets

# METHOD OF AND CIRCUIT FOR OVERSAMPLING A SIGNAL IN AN INTEGRATED CIRCUIT

FIELD OF THE INVENTION

The present invention relates generally to integrated circuits, and in particular, to a method of and circuit for oversampling a signal in an integrated circuit.

BACKGROUND OF THE INVENTION

Digital oversampling of a serial bitstream is the first step of a commonly used method of recovering data from the bitstream that is asynchronous to locally available clocks. High-speed data transceivers, such as devices operating at 1 Gb/s and higher, are often implemented in integrated circuits to enable high speed data transmission. If a design requires using the data transceiver for lower-rate applications, such as interfacing with legacy systems, an oversampling circuit must be attached to the "back end" of the data transceiver to extend the data transceiver to the lower frequency ranges. The circuit works by oversampling the incoming serial data stream, evaluating data transition locations, and extracting valid data bits from the oversampled data. The oversampled data is then analyzed to locate bit boundaries and choose the optimal samples for recovery of each bit.

A programmable logic device (PLD), which is designed to be user-programmable so that users may implement logic designs of their choices, is one type of device which implements high speed interfaces and may require digital oversampling. Programmable logic circuits of a PLD generally comprise gates which are configurable by a user of the circuit to implement a circuit design of the user. One type of PLD is a Complex Programmable Logic Device (CPLD) which includes two or more "function blocks" connected together and to input/output (I/O) resources by an interconnect switch matrix. Another type of PLD is a field programmable gate array (FPGA). In a typical FPGA, an array of configurable logic blocks (CLBs) is coupled to programmable input/output blocks (IOBs), where the CLBs and IOBs are interconnected by a hierarchy of programmable routing resources. The oversampling ratio of a circuit in a PLD is generally selectable during operation to facilitate multi-rate applications. A variety of methods for oversampling a serial bitstream may be implemented in conventional PLDs. For example, one common method is to create multiple phases of the sampling clock using one or more digital clock managers. Another common technique is to use high speed SERDES blocks as asynchronous digital sampling devices.

However, conventional circuits for enabling oversampling of a bitstream employ complex timing circuits, such as a digital clock manager (DCM) found in programmable logic devices. A DCM is a system-level clock manager that simultaneously enables internal and external clock de-skew, high-resolution phase adjustment, and flexible frequency synthesis. In particular, a DCM provides complete on-chip and off-chip clock generators, offering powerful clock management features including clock de-skew for generating clock signals which are phase-aligned to the input clock. The DCM also generates a wide range of output clock frequencies, performing very flexible clock multiplication and division. Finally, the DCM provides both coarse phase shifting and fine-grained phase shifting with dynamic phase shift control. While higher system bandwidth calls for high data rates between devices requiring advanced clock management systems, such complex circuitry of a digital clock manager is more complex and takes up more circuitry than should be necessary for providing oversampling of a signal in an integrated circuit.

Accordingly, there is a need for an improved method of and circuit for oversampling a signal in an integrated circuit.

SUMMARY OF THE INVENTION

A method of oversampling a signal in an integrated circuit is disclosed. The method comprises receiving a reference clock signal; generating at least one delayed clock signal, each having a different phase; receiving an input data signal; generating at least one delayed data signal based upon the input data signal; and generating a plurality of phase-shifted output signals, each phase-shifted output signal being based upon a different combination of a clock signal and a data signal. The method may further comprise generating a plurality of delayed clock signals having different phases by providing a first delay element and a second delay element. The generating of a delayed data signal based upon the input data signal may comprise generating a plurality of delayed data signals. For example, the generating of a plurality of delayed data signals based upon the input data signal may comprise generating a first delayed data signal by way of a first delay element and a generating a second delayed data signal by way of a second delay element. Further, generating a plurality of phase-shifted output signals may comprise receiving a delayed clock signal and a delayed data signal at a plurality of registers, wherein receiving a delayed clock signal and a delayed data signal at a plurality of registers comprises receiving a different combination of a clock signal and a data signal at each register of the plurality of registers.

According to an alternate embodiment, a method of oversampling a signal in an integrated circuit comprises receiving a reference clock signal; coupling the reference clock signal to a clock generator to generate at least one clock signal having a different phase; receiving an input data signal; coupling the input data signal to at least one delay element to generate at least one delayed data signal based upon the input data signal; and generating a plurality of phase-shifted output signals, each phase-shifted output signal being based upon a different combination of a clock signal and a data signal. The generating of a plurality of phase shifted output signals may comprise receiving a different combination of a clock signal and a data signal at each register of a plurality of registers. In particular, generating a plurality of clock signals having different phases may comprise generating a plurality of clock signals which are evenly spaced. Coupling the input data signal to a plurality of delay elements may comprise configuring a plurality of delay elements in configurable logic of a programmable logic device.

A circuit for oversampling a signal in an integrated circuit is also disclosed. The circuit comprises a first input coupled to receive a reference clock signal; a first circuit receiving the reference clock signal and generating at least one delayed clock signal; a second input coupled to receive an input data signal; a second circuit receiving the input data signal and generating at least one delayed data signal; and a plurality of registers coupled to the first circuit and the second circuit, each register receiving a different combination of a clock signal and a data signal to generate an output signal having a different phase. The first circuit may comprise a clock manager generating a plurality of delayed clock signals having different phases, while the second circuit comprises a delay element implemented in programmable logic of a programmable logic device. Alternatively, the circuit may further comprise a second delay element receiving the data signal and generating a second delayed data signal, wherein the first circuit comprises a delay element generating a first delayed clock signal and a second delay element generates a second delayed clock signal.

DETAILED DESCRIPTION OF THE DRAWINGS

Figure 1:
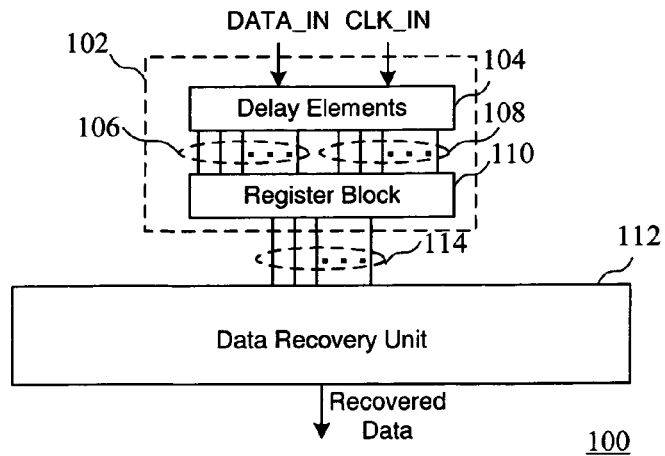
FIG. 1 is a block diagram of a circuit for oversampling a signal in an integrated according to an embodiment the present invention.

Turning first to FIG. 1, a block diagram of a circuit for oversampling a signal in an integrated according to an embodiment the present invention is shown. In one commonly used method of recovering data from a bitstream that is asynchronous to locally available clocks, a serial bitstream is oversampled. The oversampled data is then analyzed to locate bit boundaries and choose the optimal samples for recovering each bit. Referring specifically to the circuit of FIG. 1, an oversampling circuit 102 comprises a delay element block 104 having at least one delay element. The delay element block receives an input data signal (DATA_IN) and a clock signal (CLK_IN) comprising a reference clock signal, and generates a first plurality of outputs 106 based upon the input data signal and a second plurality of outputs 108 based upon the input clock signal. The outputs of the delay element block are coupled to a register block 110 having a plurality of registers. As will be described in more detail below, the outputs of the delay element block will be used to generate the samples of the input data. A data recovery unit 112 is coupled to receive the outputs 114 of the register block 110 and generate recovered data. An example data recovery unit which may be employed according to the present invention is described in U.S. patent application Ser. No. 10/930,579, entitled "High Speed Transceiver Receiving Lower Rate Data" filed on Aug. 31, 2004 by Jerry Chuang et al. and assigned to the Assignee of the present invention, the entire application of which is incorporated herein by reference.

Figure 2:
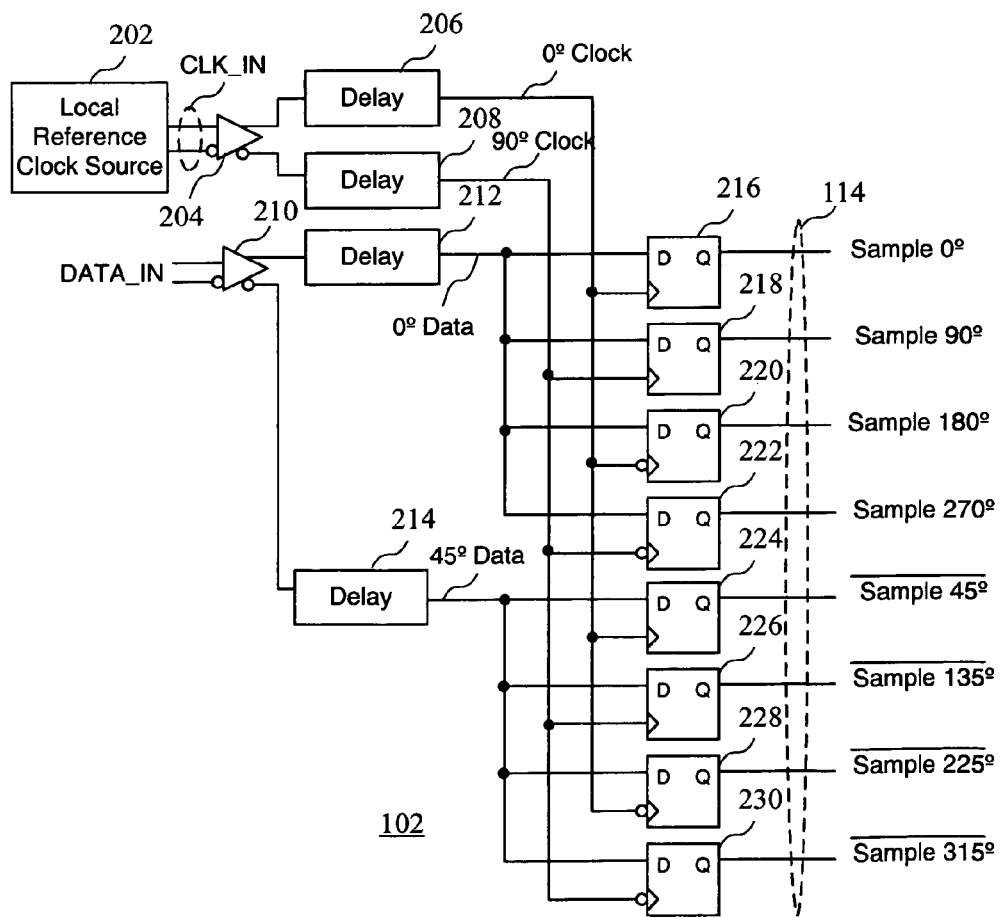
FIG. 2 is a block diagram of the delay elements and register blocks of FIG. 1 for oversampling a signal according to an embodiment of the present invention.

Turning now to FIG. 2, a block diagram of the delay elements and register blocks of FIG. 1 for oversampling a signal according to an embodiment of the present invention is shown. In particular, a local reference clock source 202 generates the clock signal CLK_IN, shown here as a differential clock signal, which is coupled to an input buffer 204. When implemented in a PLD, input buffer 204 provides complimentary signals to the fabric of the PLD from an input signal. This allows two signals based upon the input clock signal to pass through two different delay elements, delaying each signal by differing amounts. A signal from the input buffer passes through a delay element with a delay value approximately equal to one-quarter of the bit period in a circuit providing 8× oversampling. The clock output from the delay element with one-quarter bit period delay is considered to be the 0° clock and the other signal from the other delay element lags by 90° (i.e., one-quarter of a bit period). As will be described in more detail below, the generation of samples for 8× oversampling is enabled by the one-quarter bit period delay through the delay element and by the inversion of one of the clock at the input of a register which causes another 180° of phase shift. By employing both edges of these two clock phases, four clock edges equally spaced 90° apart at 0°, 90°, 180°, and 270° are generated.

More specifically, the output of the input buffer 204 is coupled to a first clock delay element 206 which generates a first clock signal 0° Clock and a second clock delay element 208 which generates a second clock signal 90° Clock. According to one embodiment of the circuit of FIG. 2, the delay element 206 is set to have no delay, but is included to match the inherent delay of the other delay elements. For example, by providing delay elements at both outputs of the buffer 204, it is easier to provide a specific phase relationship between the output of delay element 206 and delay element 208, such as a 90° phase difference between the clock signals. The data input signal DATA_IN is also shown as a differential signal coupled to a buffer 210. One copy of the bitstream goes through a delay with a one-eighth of a bit period delay while the other copy goes through a delay with zero delay. The output of the delay element 212 is considered to lag the other copy of the bit stream by one-eighth of a bit period or 45°. The outputs of the buffer 210 are coupled to a first data delay element 212 to generate a first delayed data signal and a second data delay element 214 to generate a second delayed data signal. That is, the output of the first data delay element comprises a 0° Data signal, while the output of the second delay element generates a 45° Data signal.

A plurality of registers is further coupled to receive outputs of the delay elements, where each register receives a clock signal and a data signal. Eight registers are used to sample the data for an embodiment of the circuit implementing 8× oversampling. According to one embodiment, each register receives a different combination of clock and data signals. As can be seen, a first register 216 is coupled to receive the 0° Clock signal and the 0° Data signal and generates a Sample 0° signal. A second register 218 is coupled to receive the 90° Clock signal and the 0° Data signal and generates a Sample 90° signal. A third register 220 is coupled to receive an inverted 0° Clock signal and the 0° data signal and generates a Sample 180° signal. That is, the register 220 triggers on an opposite edge of the clock signal, and therefore generates a Sample 180° signal which is 180° apart from the Sample 0° signal. A fourth register 222 is coupled to receive the inverted 90° Clock signal and the 0° Data signal and generates a Sample 270° signal. A fifth register 224 is coupled to receive the 0° Clock signal and the 45° Data signal and generates an inverted Sample 45° signal. A sixth register 226 is coupled to receive the 90° Clock signal and the 45° Data signal and generates an inverted Sample 135° signal. A seventh register 228 is coupled to receive the inverted 0° Clock signal and the 45° Data signal and generates an inverted Sample 225° signal. Finally, first register 230 is coupled to receive the inverted 90° Clock signal and the 45° Data signal and generates an inverted Sample 315° signal.

Accordingly, two registers are clocked on the rising edge of the 0° clock with one register sampling the 0° data signal of the bit stream and the other sampling the 45° delayed copy of the bit stream comprising the 45° data signal. Similarly, two registers sample the two copies of the bit stream on the rising edge of the 90° clock phase, providing 90° and 135° samples of the bit stream. Two more registers sample on the falling edge of the 0° clock phase providing 180° and 225° samples of the bit stream. Finally, two more registers sample on the falling edge of the 90° clock phase providing 270° and 315° samples of the bitstream. Accordingly, a total of 8 samples of the bitstream are generated at equally spaced intervals of one-eight of a bit period or 45° apart. The oversampling technique of the circuit of FIG. 2 takes advantage of this ability to create multiple phases of the oversampling clock and multiple phases of the data registers in the FPGA which are then used to capture eight different samples of the bit stream at eight different instances in time. Although eight registers receiving combinations of different clock signals and different data signals, additional clock signals and data signals could be used to generate a greater number of sample signals. Preferably, the clock phases are equally spaced. For example, while two clock signals are shown as Clock 0° and Clock 90°, three clock signals may be spaced by 60° as Clock 0°, Clock 60° and Clock 120°

The circuit of FIG. 2 provides a simple and efficient oversampling technique employed in integrated circuits, and in particular, in advanced programmable logic devices, such as an FPGA or a CPLD. As will be described in more detail in reference to the FPGA of FIG. 8, 8× oversampling of the bitstream may be implemented using a feature of input/output circuits and additional registers of the programmable logic device and using a local reference clock running at approximately the same frequency as the bitstream. No DCMs or other block multiplication techniques are required. Further, the oversampling technique does not require the use a serializer/deserializer (SERDES). While the maximum bit rate supported by the circuit of FIG. 2 is limited by the resolution of the delay taps in the delay element, the circuit of FIG. 2 has been verified with 270 Mbps serial data, which is a common bit rate in video broadcasting, using a 64 tap delay line for example.

Figure 3:
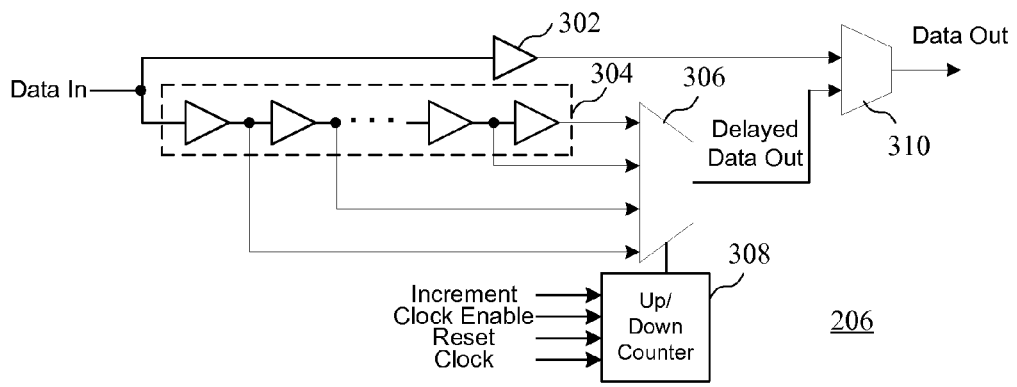
FIG. 3 is a block diagram of a delay element implemented in a circuit for oversampling a signal in an integrated according to an embodiment of the present invention.

Turning now to FIG. 3, a block diagram of a delay element implemented in a circuit for oversampling a signal in an integrated according to an embodiment of the present invention is shown. In particular, the input data signal is coupled to a first delay element 302 and a plurality of delay elements 304. A multiplexer 306 is coupled to select the output after a desired number of delay elements of the plurality of delay elements 304. The plurality of delay elements 304 may be a 64 tap delay line, for example. An up/down counter 308, which is coupled to receive an increment signal, a clock enable signal, a reset signal, and a clock signal, controls the selection of the multiplexer to generate delayed output data having a predetermined delay. A multiplexer 310 is coupled to select the output of the buffer 302 and the multiplexer 306. As will be described in reference to FIG. 8, the delay elements of FIG. 3 may be implemented in I/O blocks of a PLD. While the delay element of FIG. 3 is shown by way of example, other delay elements may be implemented.

Figure 4:
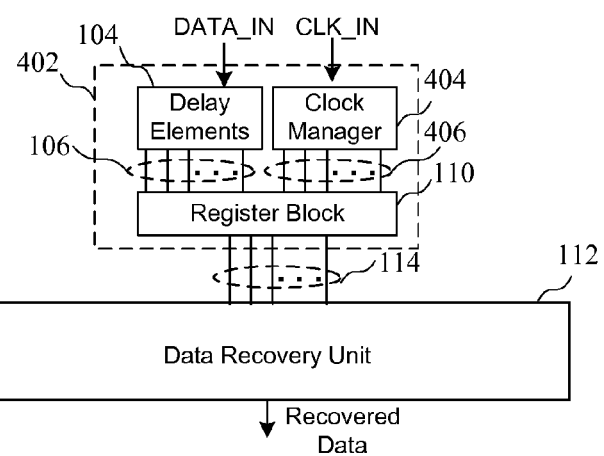
FIG. 4 is a block diagram of a circuit for oversampling a signal in an integrated according to an alternate embodiment of the present invention.

Turning now to FIG. 4, a block diagram of a circuit for oversampling a signal in an integrated according to an embodiment of the present invention is shown. In particular, an oversampling circuit 402 comprises the delay element block 104 having at least one delay element and receives an input data signal (DATA_IN) to generate the first plurality of outputs 106 based upon the input data signal. A clock manager 404 coupled to receive a clock signal (CLK_IN) comprises a clock generator generating clock signals 406 as will be described in more detail in reference to FIGS. 5 and 6. The clock manager 404 generally provides more accurate delayed output data. The outputs of the delay element block and the clock manager are coupled to the register block 110 having a plurality of registers. Finally, the data recovery unit 112 is coupled to receive the outputs 114 of the registers block 110 and output recovered data.

Figure 5:
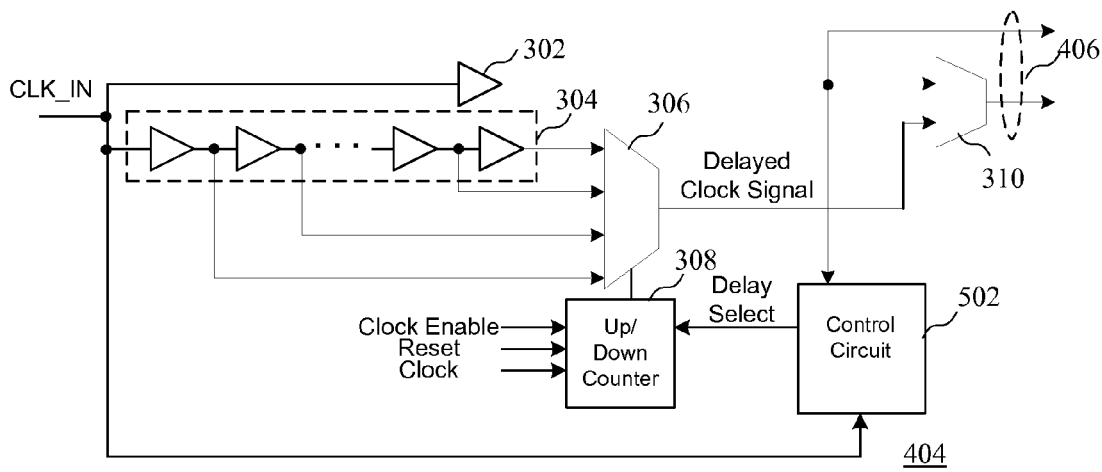
FIG. 5 is a block diagram of the clock manager of FIG. 4 according to an embodiment of the present invention.

Turning now to FIG. 5, a block diagram of the clock manager of FIG. 4 according to an embodiment of the present invention is shown. In particular, the clock manager of FIG. 5 comprises a delay-locked loop (DLL) for managing the propagation delay of the clock signals by using a delay line. The DLL of FIG. 5 comprises a linear chain of delay elements 304 and multiplexer 306 for clock selection. A feedback path provides a closed loop path for controlling the delay of the plurality of delay elements. In addition to the CLK_IN signal being coupled to the first delay element 302 and the plurality of delay elements 304, the CLK_IN signal is also coupled to a control circuit 502 which receives the output of the delay element 302 to enable a comparison of the CLK_IN signal and the output of the delay element 302. The control circuit 502 will control the amount of delay of the delayed clock signal by providing a delay select signal to the up/down counter 308 enabling the multiplexer 306 to select the output providing the desired delay.

Figure 6:
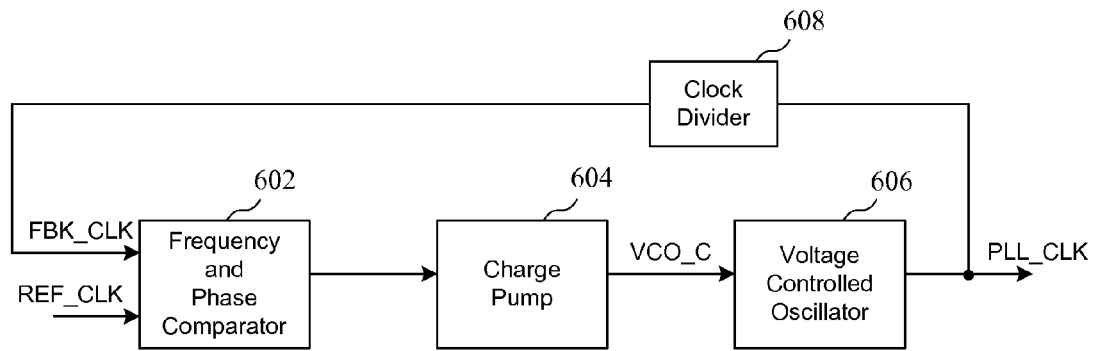
FIG. 6 is a block diagram of the clock manager of FIG. 4 according to an alternate embodiment of the present invention.

Turning now to FIG. 6, a block diagram of the clock manager of FIG. 4 according to an alternate embodiment of the present invention is shown. FIG. 6 shows a phase locked loop used to generate a PLL output clock signal PLL_O_CLK. The phase locked loop receives a reference clock signal REF_CLK having a reference frequency and generates a PLL output clock signal PLL_O_CLK having an output frequency, where the output frequency is equal to reference frequency multiplied by a multiplier. The phase locked loop comprises a frequency and phase comparator 602, a charge pump 604, a voltage controlled oscillator (VCO) 606, and a clock divider 608. The clock divider 608 divides the PLL output clock signal PLL_O_CLK to generate a feedback clock signal FBK_CLK having a frequency equal to frequency of the PLL output clock signal divided by M.

Figure 7:
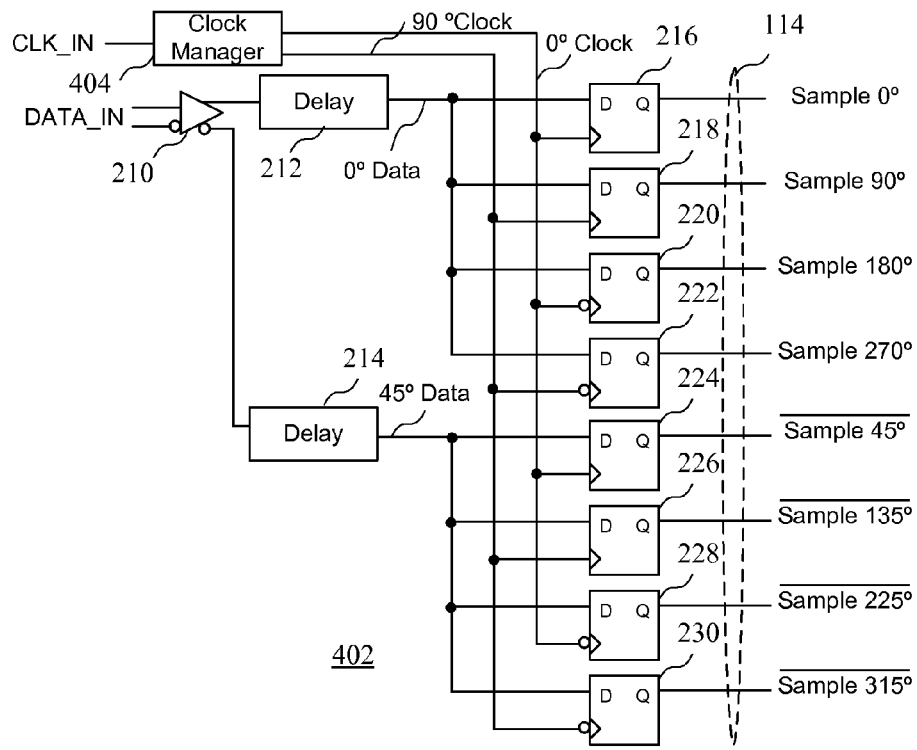
FIG. 7 is a block diagram of the delay elements, clock manager and register blocks for oversampling a signal of FIG. 4 according to an embodiment of the present invention.

The frequency and phase comparator 602 compares the phase and frequency of feedback clock to the phase and frequency of reference clock signal. Specifically, if an active edge of feedback clock signal leads an active edge of reference clock signal, the frequency and phase comparator 602 causes charge pump 604 to decrease the voltage level of a VCO control signal VCO_C, which is coupled to the voltage controlled oscillator 606, to reduce the frequency of PLL output clock signal, which is generated by the voltage controlled oscillator 606. Conversely, if an active edge of the feedback clock signal FBK_CLK lags an active edge of the reference clock signal REF_CLK, the frequency and phase comparator 602 causes the charge pump 604 to increase the voltage level of the VCO control signal to increase the frequency of the PLL output clock signal. Thus, eventually, the phase and frequency of feedback clock signal is nearly equal to the phase and frequency of reference clock signal. As shown in the embodiment of FIG. 7, the clock manager 402, which has been described according to the various embodiments of FIGS. 5 and 6, may be employed in place of the delay elements 206 and 208 of FIG. 2 to generate the clock signals 0° clock and 90° clock.

Figure 8:
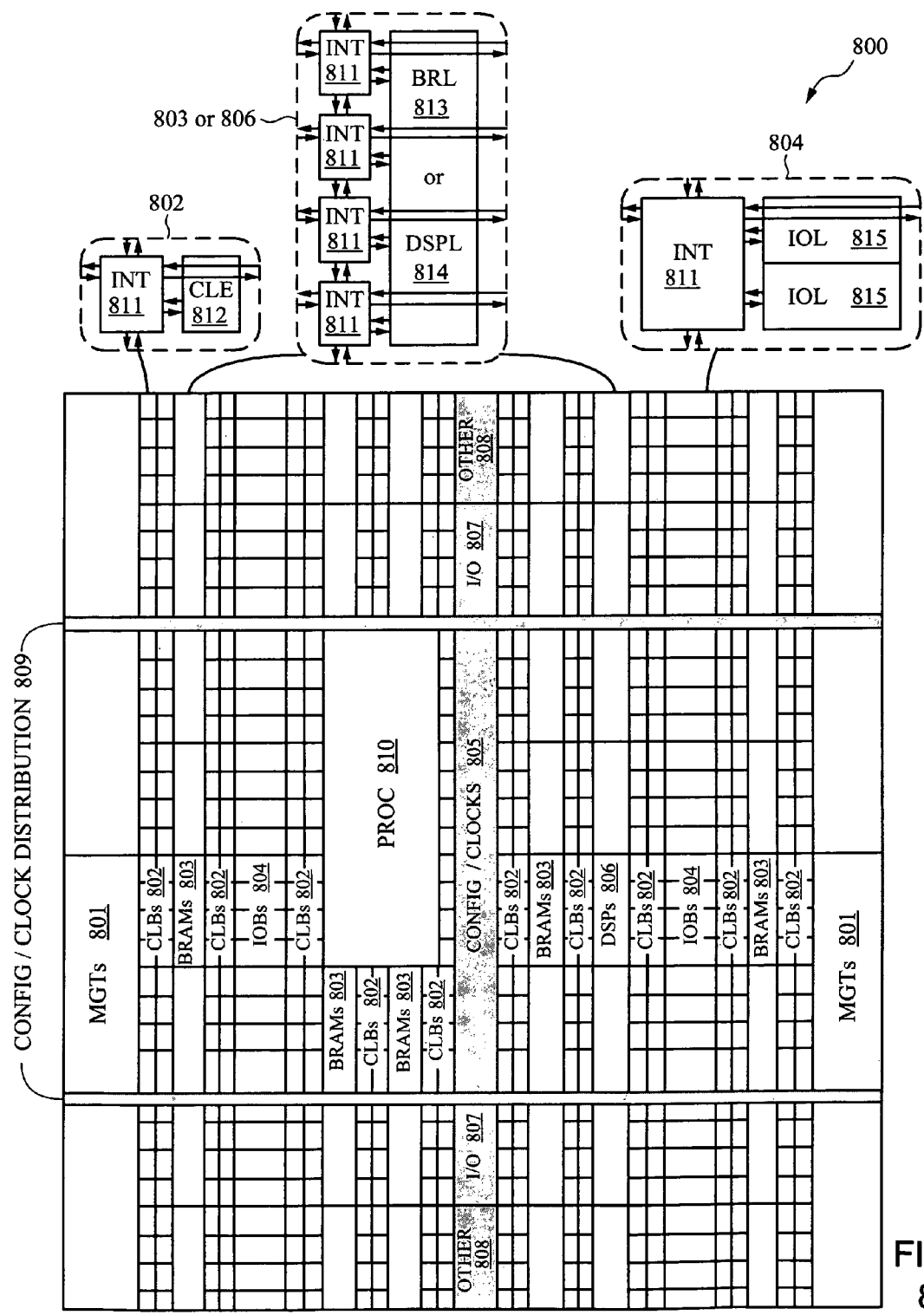
FIG. 8 is a block diagram of a programmable logic device implementing a circuit for oversampling a signal in an integrated according to an embodiment of the present invention

Turning now to FIG. 8, a block diagram of a programmable logic device implementing a circuit for oversampling a signal in an integrated according to an embodiment of the present invention is shown. The FPGA architecture 800 of FIG. 8 includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810). According to one embodiment, the delay elements of the circuits of FIGS. 1-7 may be implemented in the IOBs of the FPGA, while the registers may be implanted in the CLBs of the FPGA.

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 612) that may be programmed to implement user logic plus a single programmable interconnect element (INT 811). A BRAM 803 may include a BRAM logic element (BRL 813) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811).

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 9:
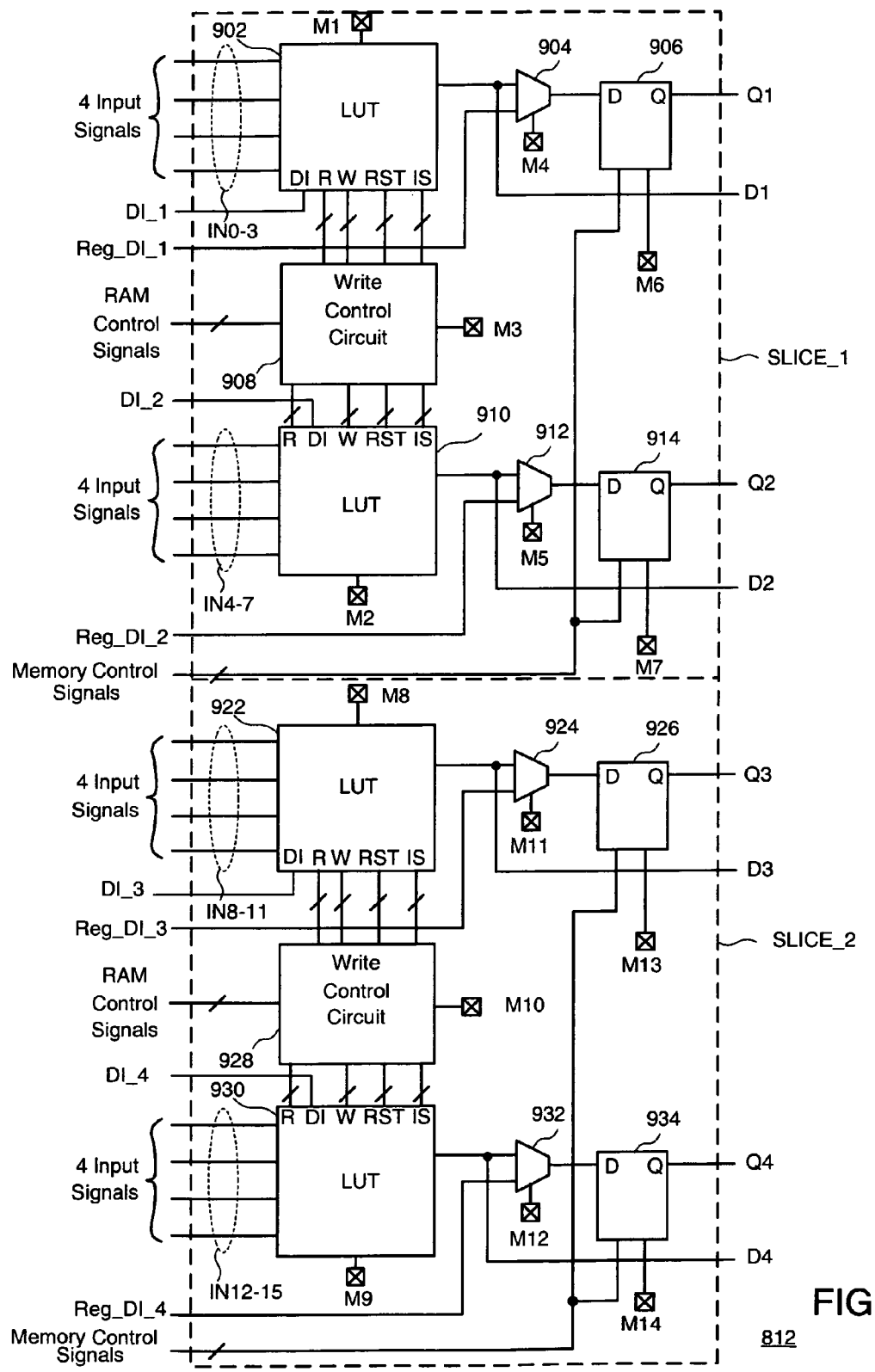
FIG. 9 is a block diagram of a configurable logic element of the programmable logic device of FIG. 8 according to an embodiment of the present invention.

Turning now to FIG. 9, a block diagram of a configurable logic element of the programmable logic device of FIG. 8 according to an embodiment of the present invention is shown. In particular, FIG. 9 illustrates in simplified form a configurable logic element of a configuration logic block 802 of FIG. 8. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by an input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 902 coupled to a multiplexer 904. In particular, the LUT 902 receives 4 input signals which are decoded to generate an output D1 associated with data stored in the LUT at the address designated by the input signals. The multiplexer 904 is adapted to receive the output of LUT 902 and a registered value of Reg_DI_1. The output of the multiplexer 904 is coupled to a register 906 which generates an output Q1.

A Write Control Circuit 908 is coupled to receive RAM control signals and generate signals to control the LUT 902. In addition to a data input (DI) coupled to receive DI_1 and conventional read and write control signals coupled to a read enable input (R) and a write enable input (W), respectively, the LUT 902 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 910 coupled to a multiplexer 912. The LUT 910 is adapted to receive input signals IN4-IN7, while the multiplexer 912 is coupled to receive the output D2 of the LUT 910 and the registered input value Reg_DI_2. The output of the multiplexer 912 is coupled to a register 714 which generates an output Q2. The write control circuit 908 also generates a partial reset signal and an initial state signal for selectively resetting or setting one or more of the bits of the LUT 910.

Similarly, slice 2 comprises a function generator implemented as a LUT 922 coupled to a multiplexer 924. The LUT 922 is adapted to receive input signals IN8-IN11, while the multiplexer 924 is coupled to receive the output of the LUT 922 and a registered input value Reg_DI_3. The output of the multiplexer 924 is coupled to a register 926 which generates an output Q3. A Write Control Circuit 928 is coupled to receive RAM control signals and generate signals to control the LUT 922. In particular, input signals IN8-IN11 are decoded to generate an output D3 associated with data stored in the LUT at the address designated by the input signals. The LUT 922 comprises a partial reset input (RST) for receiving a partial reset signal, and an initial state input (IS) for receiving an initial state signal. Similarly, slice 2 comprises a function generator implemented as a LUT 930 coupled to a multiplexer 932. The LUT 930 is adapted to receive input signals IN12-IN15, while the multiplexer 932 is coupled to receive the output D4 of the LUT 930 and a registered input value Reg_DI_4. The output of the multiplexer 932 is coupled to a register 934 which generates an output Q4. The write control circuit 928 also generates a partial reset signal and an initial state signal for selectively resetting or setting one or more of the bits of the LUT 930.

Figure 10:
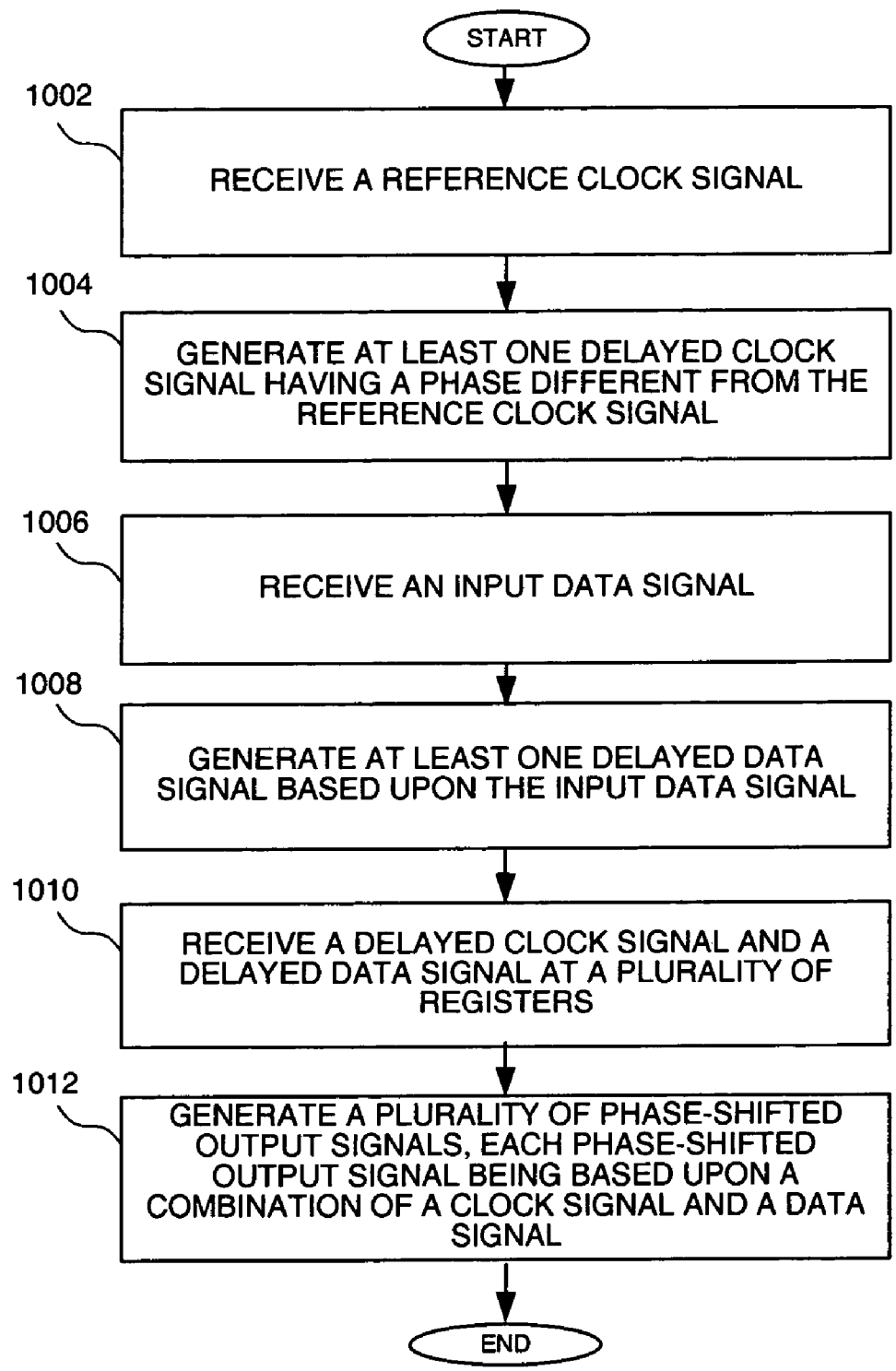
FIG. 10 is a flowchart showing a method of oversampling a signal in an integrated according to an embodiment the present invention.

Finally, turning to FIG. 10, a flowchart shows a method of oversampling a signal in an integrated circuit according to an embodiment of the present invention. In particular, a reference clock signal is received at a step 1002. At least one delayed clock signal is generated having a phase different from the reference clock signal at a step 804. An input data signal is received at a step 1006. At least one delayed data signal is generated based upon the input data signal at a step 1008. A delayed clock signal and a delayed data signal are received a plurality of registers at a step 1010. A plurality of phase-shifted output signals are generated, each phase-shifted output signal being based upon a combination of a clock signal and a data signal at a step 1012. The method of FIG. 10 could be implemented using any of the circuits of FIGS. 1-7 as described in reference to these figures, or other suitable circuits.

It can therefore be appreciated that the new and novel method of and circuit for oversampling a signal in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of oversampling a signal in an integrated circuit, the method comprising:
receiving a reference clock signal;
generating at least one delayed clock signal based upon the reference clock signal, each delayed clock signal having a different phase;
receiving an input data signal;
generating at least one delayed data signal based upon the input data signal; and
generating a plurality of phase-shifted output signals, each phase-shifted output signal being based upon a different combination of a clock signal, selected from the at least one delayed clock signal and the reference clock signal, and a data signal, selected from the at least one delayed data signal and the input data signal, wherein each clock signal of the at least one delayed clock signal and the reference clock signal is used to generate more than one phase-shifted output signal of the plurality of phase-shifted output signals and wherein each data signal of the at least one delayed data signal and the input data signal is used to generate more than one phase-shifted output signal of the plurality of phase-shifted output signals, and wherein each clock signal of the at least one delayed clock signal and the reference clock signal is used with each data signal of the at least one delayed data signal and the input data signal to generate the plurality of phase-shifted output signals.

2. The method of claim 1 wherein generating the at least one delayed clock signal comprises generating a plurality of delayed clock signals having different phases.

3. The method of claim 2 wherein generating the plurality of delayed clock signals having different phases comprises generating a first delayed clock signal by way of a first delay element and generating a second delayed clock signal by way of a second delay element.

4. The method of claim 1 wherein generating the at least one delayed data signal based upon the input data signal comprises generating a plurality of delayed data signals.

5. The method of claim 4 wherein generating the plurality of delayed data signals comprises generating a first delayed data signal by way of a first delay element and a generating a second delayed data signal by way of a second delay element.

6. The method of claim 1 wherein generating a plurality of phase-shifted output signals comprises receiving a different combination of a delayed clock signal and a delayed data signal at each register of a plurality of registers.

7. A method of oversampling a signal in an integrated circuit, the method comprising:
receiving a reference clock signal;
coupling the reference clock signal to a clock manager to generate at least one clock signal having a different phase;
receiving an input data signal;
coupling the input data signal to at least one delay element to generate at least one delayed data signal based upon the input data signal; and
generating a plurality of phase-shifted output signals, each phase-shifted output signal being based upon a different combination of a clock signal, selected from the at least one clock signal and the reference clock signal, and a data signal, selected from the at least one delayed data signal and the input data signal, wherein each clock signal of the at least one clock signal having a different phase and the reference clock signal is used to generate more than one phase-shifted output signal of the plurality of phase-shifted output signals and wherein each data signal of the at least one delayed data signal and the input data signal is used to generate more than one phase-shifted output signal of the plurality of phase-shifted output signals, and wherein each clock signal of the at least one delayed clock signal and the reference clock signal is used with each data signal of the at least one delayed data signal and the input data signal to generate the plurality of phase-shifted output signals.

8. The method of claim 7 wherein coupling the reference clock signal to a clock manager comprises generating a plurality of clock signals having different phases.

9. The method of claim 8 wherein coupling the input data signal to at least one delay element comprises coupling the input data signal to a plurality of delay elements.

10. The method of claim 9 wherein generating the plurality of phase-shifted output signals comprises receiving a different combination of a clock signal and a data signal at each register of a plurality of registers.

11. The method of claim 10 wherein generating a plurality of clock signals having different phases comprises generating a plurality of clock signals which are evenly spaced.

12. The method of claim 9 wherein coupling the input data signal to a plurality of delay elements comprises coupling the input data signal to a first delay element which is set to provide no delay.

13. The method of claim 9 wherein coupling the input data signal to a plurality of delay elements comprises providing delay elements in input/output blocks of a programmable logic device.

14. A circuit for oversampling a signal in an integrated circuit, the circuit comprising:
- a first input coupled to receive a reference clock signal;
- a first circuit receiving the reference clock signal and generating at least one delayed clock signal;
- a second input coupled to receive an input data signal;
- a second circuit receiving the input data signal and generating at least one delayed data signal; and
- a plurality of registers coupled to the first circuit and the second circuit, each register receiving a different combination of a clock signal, selected from the at least one delayed clock signal and the reference clock signal, and a data signal, selected from the at least one delayed data signal and the input data signal, to generate an output signal having a different phase, wherein each clock signal of the at least one delayed clock signal and the reference clock signal is coupled to more than one register of the plurality of registers and wherein each data signal of the at least one delayed data signal and the input data signal is coupled to more than one register of the plurality of registers and wherein each clock signal of the at least one delayed clock signal and the reference clock signal is used with each data signal of the at least one delayed data signal and the input data signal to generate a plurality of phase-shifted output signals.

15. The circuit of claim 14 wherein the second circuit comprises a delay element implemented in programmable logic of a programmable logic device.

16. The circuit of claim 15 wherein the first circuit comprises a clock manager generating a plurality of delayed clock signals having different phases.

17. The circuit of claim 16 further comprising a second delay element receiving the input data signal and generating a second delayed data signal.

18. The circuit of claim 14 wherein the first circuit comprises a circuit selected from a group consisting of a delay element, a PLL, a DLL, and a digital clock manager.

19. The circuit of claim 14 further comprising a third circuit generating a second delayed clock signal.

* * * * *